United States Patent
Socha et al.

(10) Patent No.: US 7,639,864 B2
(45) Date of Patent: Dec. 29, 2009

(54) METHOD, PROGRAM PRODUCT AND APPARATUS FOR OPTIMIZING ILLUMINATION FOR FULL-CHIP LAYER

(75) Inventors: Robert J. Socha, Campbell, CA (US); Jang Fung Chen, Cupertino, CA (US)

(73) Assignee: ASML Masktools B.V. (NL)

( * ) Notice: Subject to any disclaimer, the term of this patent is extended or adjusted under 35 U.S.C. 154(b) by 886 days.

(21) Appl. No.: 11/359,781

(22) Filed: Feb. 23, 2006

(65) Prior Publication Data

US 2006/0204090 A1 Sep. 14, 2006

Related U.S. Application Data

(60) Provisional application No. 60/654,962, filed on Feb. 23, 2005.

(51) Int. Cl.
- *G06K 9/00* (2006.01)
- *G06F 17/50* (2006.01)
- *G03F 1/00* (2006.01)

(52) U.S. Cl. .................. 382/144; 382/181; 716/19; 430/4; 430/14

(58) Field of Classification Search .......... 382/100, 382/144–151, 168–170, 181, 190–195, 203–206, 382/212; 716/19–21; 430/4–5, 8–9, 14–15, 430/290–292, 296
See application file for complete search history.

(56) References Cited

U.S. PATENT DOCUMENTS

| | | | |
|---|---|---|---|
| 6,373,553 B1 * | 4/2002 | Singh | 355/55 |
| 6,584,420 B1 * | 6/2003 | Minami | 702/82 |
| 6,653,026 B2 * | 11/2003 | Pierrat et al. | 430/5 |
| 6,792,591 B2 * | 9/2004 | Shi et al. | 716/19 |
| 6,871,337 B2 * | 3/2005 | Socha | 716/19 |
| 6,964,032 B2 * | 11/2005 | Liebmann et al. | 716/19 |
| 7,302,111 B2 * | 11/2007 | Olsson et al. | 382/266 |
| 7,523,439 B2 * | 4/2009 | Wen et al. | 716/21 |
| 2002/0157081 A1 * | 10/2002 | Shi et al. | 716/19 |
| 2004/0156030 A1 | 8/2004 | Hansen | |

(Continued)

FOREIGN PATENT DOCUMENTS

EP 1 439 420 A1 7/2004

(Continued)

OTHER PUBLICATIONS

European Office Action, issued in corresponding European Patent Application No. 06250911.2, dated on Jun. 19, 2007.

(Continued)

*Primary Examiner*—Manav Seth
(74) *Attorney, Agent, or Firm*—Pillsbury Winthrop Shaw Pittman LLP (57) ABSTRACT

Optimization of illumination for a full-chip layer is disclosed. A pitch frequency of the full-chip layer is determined so as to generate a pitch frequency histogram of the full-chip layer. The pitch frequency indicates how often a given pitch occurs in the full-chip layer. The pitch frequency histogram is equated to be the first eigenfunction from the sum of coherent system representation of a transformation cross coefficient. An integral equation for the first eigenfunction of the transformation cross coefficient is solved so as to define the optimal illumination for imaging the full-chip layer.

31 Claims, 9 Drawing Sheets

U.S. PATENT DOCUMENTS

2005/0015233 A1 1/2005 Gordon
2007/0030470 A1* 2/2007 Tinnemans et al. ............ 355/67
2008/0015812 A1* 1/2008 Khuong et al. .............. 702/167

FOREIGN PATENT DOCUMENTS

| EP | 1 465 016 A2 | 10/2004 |
| --- | --- | --- |
| EP | 1 473 596 A2 | 11/2004 |
| EP | 1 530 084 A1 | 5/2005 |
| JP | 2000-243690 | 9/2000 |

OTHER PUBLICATIONS

Australian Office Action issued in Australian Patent Application No. SG 200601144-9, mailed Feb. 8, 2007.

* cited by examiner

Memory Flash Contact Core Area

Fig. 2B

Memory Flash pattern with 250 nm pitch design rule
First eigenfunction $\Phi_1$ of the TCC

Fig. 2C

Memory Flash pattern with 250nm pitch design rule
Flash pattern includes the core and the periphery

Fig. 3A

Memory Flash pattern with 200nm pitch design rule
Flash pattern includes the core and the periphery

Fig. 3B

Memory Flash pattern with 200nm pitch design rule
First eigenfunction $\Phi_1$ of the TCC

Fig. 4A

Contact Array Pitch of 250nm Optimized Illumination

Fig. 4B

Contact Array Pich of 250nm
First eigenfunction $\Phi_i$ of the TCC

Fig. 5A

Contact Array Pitch of 200nm Optimized Illumination

Fig. 5B

Contact Array Pich of 200nm
First eigenfunction $\Phi_1$ of the TCC

Fig. 6A

Periodic DRAM Pattern with k1=0.31
Optimize Illumination

Fig. 6B

Periodic DRAM Pattern with k1=0.31 First
eigenfunction $\Phi_1$ of the TCC and the pitch frequency

METHOD, PROGRAM PRODUCT AND APPARATUS FOR OPTIMIZING ILLUMINATION FOR FULL-CHIP LAYER

CLAIM OF PRIORITY

This patent application, and any patent(s) issuing therefrom, claims priority to U.S. provisional patent application No. 60/654,962, filed on Feb. 23, 2005, which is incorporated herein by reference in its entirety.

TECHNICAL FIELD

This disclosure relates generally to microlithographic imaging. More particularly, it relates to optimization of illumination for a full-chip imaging by analyzing a pitch frequency of a design on the layer, and then optimizing the illumination utilizing the pitch frequency.

BACKGROUND

Lithographic apparatus can be used, for example, in the manufacture of integrated circuits (ICs). In such a case, the mask may contain a circuit pattern corresponding to an individual layer of the IC, and this pattern can be imaged onto a target portion (e.g., comprising one or more dies) on a substrate (silicon wafer) that has been coated with a layer of radiation-sensitive material (resist). In general, a single wafer will contain a whole network of adjacent target portions that are successively irradiated via the projection system, one at a time. In one type of lithographic projection apparatus, each target portion is irradiated by exposing the entire mask pattern onto the target portion in one go; such an apparatus is commonly referred to as a wafer stepper. In an alternative apparatus, commonly referred to as a step-and-scan apparatus, each target portion is irradiated by progressively scanning the mask pattern under the projection beam in a given reference direction (the "scanning" direction) while synchronously scanning the substrate table parallel or anti-parallel to this direction. Since, in general, the projection system will have a magnification factor M (generally >1), the speed V at which the substrate table is scanned will be a factor M times that at which the mask table is scanned. More information with regard to lithographic devices as described herein can be gleaned, for example, from U.S. Pat. No. 6,046,792, incorporated herein by reference.

In a manufacturing process using a lithographic projection apparatus, a mask pattern is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g., an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc.

For the sake of simplicity, the projection system may hereinafter be referred to as the "optics;" however, this term should be broadly interpreted as encompassing various types of projection systems, including refractive optics, reflective optics, and catadioptric systems, for example. The radiation system may also include components operating according to any of these design types for directing, shaping or controlling the projection beam of radiation, and such components may also be referred to below, collectively or singularly, as a "lens." Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Twin stage lithographic apparatus are described, for example, in U.S. Pat. No. 5,969,441, incorporated herein by reference.

The photolithographic masks referred to above comprise geometric patterns corresponding to the circuit components to be integrated onto a silicon wafer. The patterns used to create such masks are generated utilizing CAD (computer-aided design) programs, this process often being referred to as EDA (electronic design automation). Most CAD programs follow a set of predetermined design rules in order to create functional masks. These rules are set by processing and design limitations. For example, design rules define the space tolerance between circuit devices (such as gates, capacitors, etc.) or interconnect lines, so as to ensure that the circuit devices or lines do not interact with one another in an undesirable way. A critical dimension of a circuit can be defined as the smallest width of a line or hole or the smallest space between two lines or two holes. Thus, the CD determines the overall size and density of the designed circuit.

As illumination systems have evolved from producing conventional to annular, and on to quadrupole and more complicated illumination configurations, the control parameters have concurrently become more numerous. In a conventional illumination pattern, a circular area including the optical axis is illuminated, the only adjustment to the pattern being to alter the outer radius ($\sigma_r$). Annular illumination requires the definition of an inner radius ($\sigma_c$) in order to define the illuminated ring. For multipole patterns, the number of parameters which can be controlled continues to increase. For example, in a quadrupole illumination configuration, in addition to the two radii, a pole angle $\alpha$ defines the angle subtended by each pole between the selected inner and outer radii.

Concurrently, mask technology has been evolving as well. Binary intensity masks have given way to phase-shifted masks and other advanced designs. While a binary mask simply transmits, reflects or blocks imaging radiation at a given point, a phase-shifted mask may attenuate some radiation or it may transmit or reflect the light after imparting a phase shift, or both. Phase-shifted masks have been used in order to image features which are on the order of the imaging radiation's wavelength or smaller, since diffraction effects at these resolutions can cause poor contrast and end-of-line errors, among other problems.

The various types of illumination configurations can be used to provide improvements in resolution, depth of focus, contrast and other characteristics of the printed image. However, each illumination type has certain tradeoffs. For example, improved contrast may come at the expense of depth of focus; each type of mask has a performance which is dependent on the pattern to be imaged as well.

Conventionally, in order to select the optimum illumination mode for a given pattern to be imaged onto a wafer, a series of test wafers has been exposed and compared on a hit-or-miss basis. As noted above, modern illumination systems have ever increasing numbers of variables which can be manipulated. As the various permutations of variable settings increase, the cost of trial and error optimization of illumination configurations becomes very large and quantitative methods of selecting illumination configurations are needed. Furthermore, although an illumination optimization method has been proposed in which only a small area, such as a particular cell in a memory, is optimized, it is desirable to develop a method of optimizing illumination for a full-chip layer.

SUMMARY

This disclosure relates to a method, computer program product and apparatus for optimizing illumination of a full-chip layer. In accordance with the illumination optimization process of this disclosure, a pitch frequency of the features contained in the full-chip layer is determined to create a pitch frequency histogram of the full-chip layer. All pitches may equally be weighted in the pitch frequency histogram. The pitch frequency indicates how often a given pitch appears on the full-chip layer. The pitch frequency histogram is then equated to be the first eigenfunction of the sum of coherent system representation of a transformation cross coefficient. Thereafter, an integral equation for the first eigenfunction of the transformation cross coefficient is solved so as to provide the optimized illumination for the given full-chip layer.

For example, the integral equation for the first eigenfunction of the transformation cross coefficient may be solved such that the first eigenfunction becomes substantially identical to the pitch frequency. A difference between the pitch frequency and the first eigenfunction can be minimized by using a merit function to solve the integral equation for the first eigenfunction of the transformation cross coefficient. The merit function may be essentially the convolution of the first eigenfunction with the pitch frequency. Alternatively, the integral equation for the first eigenfunction of the transformation cross coefficient may be solved such that the first eigenfunction has a value of one for every non-zero value in the pitch frequency.

In one embodiment, the pitch frequency can be obtained by determining separation between adjacent features on the full-chip layer that are within a coherence radius. The coherence radius is set by source and projection optics. In another embodiment, the pitch frequency may be obtained by representing adjacent features on the full-chip layer with Dirac delta functions and measuring separation between the Dirac delta functions. For example, the pitch frequency for a random hole pattern or for a periodic hole pattern can be obtained as a function of hole separation and as a function of angular separation.

In addition, it is possible to determine whether pitch frequencies fall into a negative region of the first eigenfunction by using the optimized illumination. The pitch frequencies which fall into the negative region may be separated into another layer to be imaged with a second exposure, thereby optimizing illumination for another layer.

Although specific reference may be made in this text to the use of the invention in the manufacture of ICs, it should be explicitly understood that the invention has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle," "wafer" or "die" in this text should be considered as being replaced by the more general terms "mask," "substrate" and "target portion," respectively.

The invention itself, together with further objects and advantages, can be better understood by reference to the following detailed description and the accompanying drawings.

DESCRIPTION

A illumination optimization process for a full-chip layer of the present invention will be described with reference to the accompanying drawings. Although this process is applicable to any layer such as bright field gate or dark field metal layers, and any target pattern, this exemplary embodiment addresses optimization of illumination of a contact layer. The process is applicable for optimizing the illumination for random contact patterns or for period contact patterns such as a memory. For memory patterns, illumination is optimized for a core and for a periphery at the same time. Unlike current techniques in which illumination is optimized for a small area, illumination in this process is optimized for the full-chip. Generally, the illumination may be optimized by analyzing pitch frequencies of the contact hole layer. The pitch frequency describes how often a particular pitch appears on a contact layer. The pitch frequency can be calculated for a full chip, for example, by using an EDA tool such as MaskTool's MaskWeaver™.

The pitch frequency of a contact layer may be calculated by determining the separation between adjacent contacts that are within a given coherence radius. The coherence radius is set by the source and projection optics. For a coherent source, the coherence radius is calculated by using the Airy function of the projection optics. When the Airy function decreases below a certain value, the Airy function can be truncated to a certain length. Any feature separated by a distance larger than the length has no influence on the given feature to be imaged. This length is called the coherence radius. The coherence radius is also affected by the shape of the source illumination.

Source shapes such as dipole have a larger coherence radius than conventional source shapes. A general rule of thumb for the coherence radius is 4λ/NA, which is independent of the source illumination.

Alternatively, the pitch frequency of a contact layer may be calculated by representing the adjacent contacts with Dirac delta functions and then by measuring the separation between these delta functions. For layers other than contacts such as gate or metal, the pitch frequency of a layer with lines can be calculated by replacing the critical lines on the chip with Dirac line functions. The separation between these line functions is measured to create the pitch frequency of the given layer.

This pitch frequency can then be used in the source optimization method outlined below that is designed for contact holes as an example of this embodiment. It is again noted that the method of the present invention is not limited to use with contact hole patterns, but can be utilized to optimize the illumination for essentially any target patterns.

For a random hole pattern or for a periodic hole pattern, for example, the pitch frequency can be calculated as a function of hole separation and as a function of angular separation. Using the pitch frequency, the optimal illumination is calculated. The optimal illumination is calculated by using the sum of coherent systems (SOCS) method. In the SOCS method, most of the imaging for a contact hole pattern may be represented with the first eigenfunction. In order to achieve the largest contrast, the first eigenfunction should be equivalent to the pitch frequency of the contact hole pattern. Another possibility is the first eigenfunction should have a value of one for every non-zero value in the pitch frequency. In the method described below, the illumination is optimized such that the first eigenfunction is equivalent to the pitch frequency. Because the projection lens low pass filters the object, the number of variables needed to optimize is limited. Therefore, it is more computationally efficient to perform the optimization in the spatial frequency domain. Also, due to the low pass filtering of the projection lens, it is quite difficult to optimize the illumination such that the first eigenfunction is equivalent to the pitch frequency. Hence, a more physical optimization metric is desired due to the low pass filtering. One such suitable optimization metric is to optimize the illumination such that the summation of the pitch frequency multiplied by the first eigenfunction is maximized. This metric has a physical significance as this metric is substantially similar to convolution of the mask pattern with the first eigenfunction.

Figure 1:
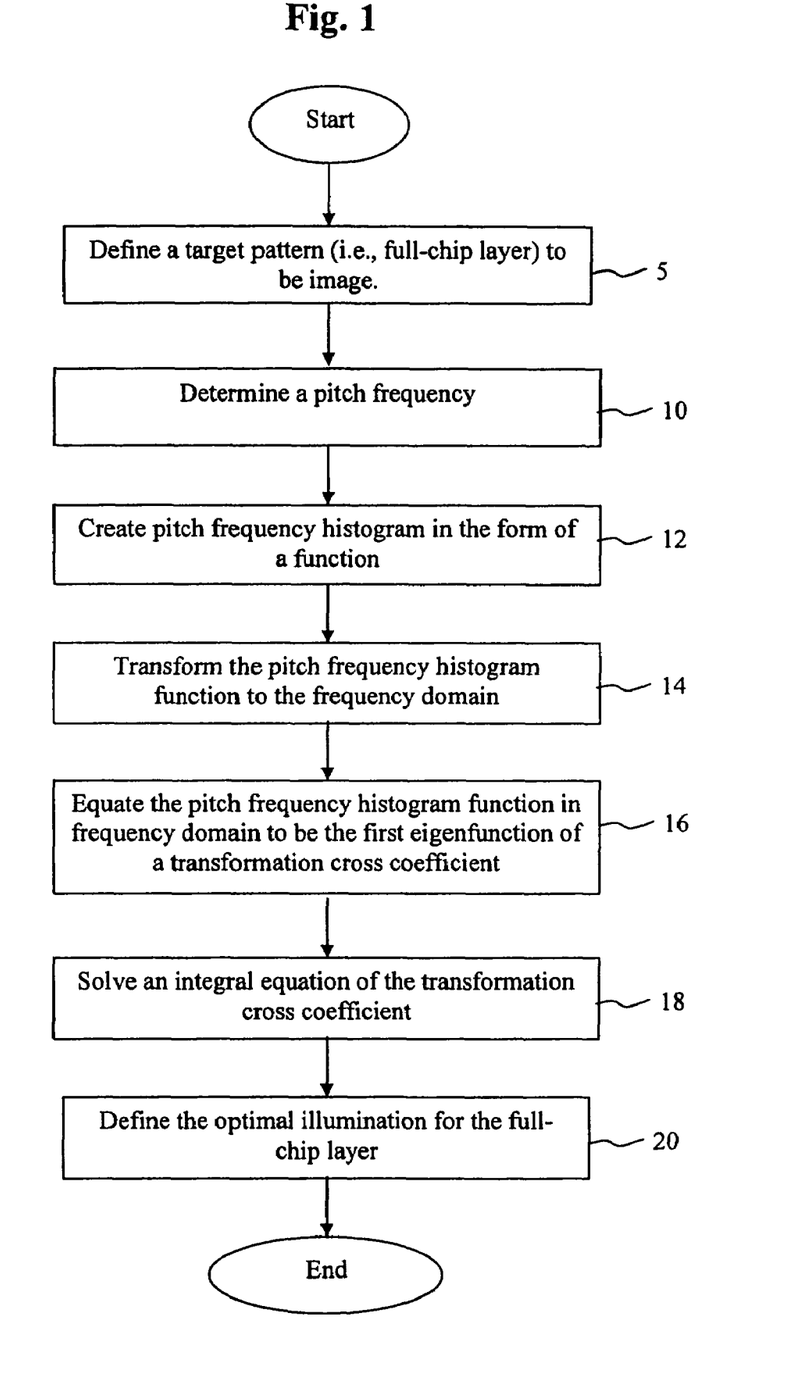
FIG. 1 is an exemplary flowchart illustrating the method of optimizing illumination for a full-chip layer in accordance with an embodiment of the present invention.

FIG. 1 is an exemplary flowchart illustrating the method of optimizing illumination for a full-chip layer in accordance with an embodiment of the present invention. The transmission cross coefficient, TCC, is the autocorrelation of the illumination pupil with the projection pupil, described, for instance, by M. Born and E. Wolf, Principles of Optics 530 (6th ed., Pergamon Press), incorporated herein by reference. The TCC represents the image transfer function of the optical system. Using the TCC formulation in calculating the wafer image from a mask is advantageous because the TCC is independent of the mask. Since the TCC is independent of the mask, the TCC formulation is often used in OPC and RET methods. The image on the wafer is calculated by integrating over the product of the TCC and the mask. The first step in the process, step 5, is to determine the target pattern (i.e., the full-chip layer) to be illuminated. The next step, step 10, is to determine a pitch frequency of the target pattern, which in this example is a contact hole pattern. The pitch frequency is calculated, for example, by analyzing the space between adjacent features for each feature in the pattern in both the horizontal and vertical directions. By performing this analysis, it is possible to determine how often a particular pitch occurs in the target pattern and how or what type of orientation it has, i.e., horizontal, vertical, or rotated.

Then, the next step in the process, step 12, is to create a pitch frequency histogram which is in the form of a function in a spatial domain, based on the pitch frequency determined in step 10. It is desirable to weight all pitches equally in the histogram function in the spatial domain so that in the given embodiment, all pitches are treated the same in the optimization process regardless of the frequency in which a given pitch occurs. This allows for illumination optimization of all pitches contained in the target pattern, and thereby the illumination for the "full-chip" is optimized.

The next step in the process, step 14, is to transform the histogram function in spatial domain into the frequency domain, as shown by equation 1. As mentioned above, in this embodiment, the illumination is optimized such that the first eigenfunction represents the pitch frequency.

$$\Phi(m,n) = FT\{\phi(x,y)\} \quad \text{Equation 1}$$

Referring to equation 1, $\phi$ is the pitch frequency histogram function of the contact hole design (i.e., target pattern), $\Phi$ is limited by the number of spatial frequencies that a projection lens can collect. The maximum number of spatial frequencies in the x direction, $m_{max}$, is given by:

$$m_{max} = \text{floor}\frac{P_x NA(1+\sigma_{max})}{\lambda} \quad \text{Equation 2}$$

The maximum number of spatial frequencies in the y direction, $n_{max}$, is given by:

$$n_{max} = \text{floor}\frac{P_y NA(1+\sigma_{max})}{\lambda} \quad \text{Equation 3}$$

where $P_x$ is the pitch in x and $P_y$ is the pitch in y, NA is the numerical aperture, $\sigma_{max}$ is the maximum possible sigma of the illumination, and $\lambda$ is the wavelength. $P_x$ and $P_y$ are set to be as large as possible to ensure that contacts separated by distances greater than $P_x$ and $P_y$ do not affect imaging. A typical value for $P_x$ and $P_y$ is $P_x = P_y = 8\lambda/NA$ which is twice the coherence radius of 4λ/NA.

The next step in the process, step 16, is to equate the pitch frequency histogram function in the frequency domain to be the first eigenfunction of the sum of coherent systems (SOSC) representation of a transformation cross coefficient (TCC), as represented by equation 4.

$$\sum_p \sum_q TCC(m,n,p,q)\Phi(p,q) = \Phi(m,n) \quad \text{Equation 4}$$

where TCC (m,n,p,q) is as follows:

$$TCC(m,n,p,q) = \int\int J(\alpha,\beta)K\left(\alpha+\frac{\lambda m}{P_x NA}, \beta+\frac{\lambda n}{P_y NA}\right) \\ K^*\left(\alpha+\frac{\lambda p}{P_x NA}, \beta+\frac{\lambda q}{P_y NA}\right) d\alpha d\beta \quad \text{Equation 5}$$

Referring to equation 5, J is illumination pupil (quantity to be solved for), α and β are the direction cosine coordinates of the illumination pupil, K is the projection pupil, m and p are discrete diffraction orders of the x direction in the spatial frequency, and n and q are discrete diffraction orders of the y direction in the spatial frequency.

Equation 5 represents an integral equation of the TCC. The source, J(α,β), which represents the illumination, is optimized by solving the integral equation of the TCC. The TCC is an autocorrelation of the illumination pupil. Equation 5 indicates the autocorrelation of the illumination pupil centered at (0,0) with projection pupil centered at $$\left[\frac{\lambda m}{P_x NA}, \frac{\lambda n}{P_y NA}\right]$$

and with the complex conjugate of the projection pupil centered at $$\left[\frac{\lambda p}{P_x NA}, \frac{\lambda q}{P_y NA}\right]$$

where λ represents the wavelength of the illumination optics.

As indicated by equation 4, the TCC can be decomposed into a set of eigenfunctions, Φ, through the SOCS. Since the illumination pupil J is the parameter to be optimized, the integral equation of the TCC above can be solved by using the orthogonal property of the eigenfunctions. In the orthogonal principle, the first eigenfunction of the SOCS, Φ, is set to be equivalent to the low pass filtered Fourier transformation of the pitch frequency histogram function, ϕ, as shown in equation 4.

The integral equation of the TCC in equation 5 is substituted into the orthogonal equation 4, resulting in equation 6.

$$\sum_p \sum_q \left[ \int\int J(\alpha,\beta) K\left(\alpha + \frac{\lambda m}{P_x NA}, \beta + \frac{\lambda n}{P_y NA}\right) K^*\left(\alpha + \frac{\lambda p}{P_x NA}, \beta + \frac{\lambda q}{P_y NA}\right) d\alpha d\beta \right] \Phi(p,q) = \Phi(m,n) \quad \text{Equation 6}$$

The summation and integration in equation 6 is reordered, resulting in equation 7.

$$\int\int J(\alpha,\beta) K\left(\alpha + \frac{\lambda m}{P_x NA}, \beta + \frac{\lambda n}{P_y NA}\right) d\alpha$$
$$d\beta\left[\sum_p \sum_q K^*\left(\alpha + \frac{\lambda p}{P_x NA}, \beta + \frac{\lambda q}{P_y NA}\right) \Phi(p,q)\right] = \Phi(m,n) \quad \text{Equation 7}$$

The quantity inside the brackets [ ], in equation 7 is substituted with F(α,β) as given in equation 8. This substitution is explicitly done because F(α,β) can be precalculated.

$$F(\alpha,\beta,) = \sum_p \sum_q K^*\left(\alpha + \frac{\lambda p}{P_x NA}, \beta + \frac{\lambda q}{P_y NA}\right) \Phi(p,q) \quad \text{Equation 8}$$

After substituting the equations above, the next step in this process, step 18 is to solve the following integral equation of the TCC for the illumination pupil, J.

$$\int\int J(\alpha,\beta) K\left(\alpha + \frac{\lambda m}{P_x NA}, \beta + \frac{\lambda n}{P_y NA}\right) F(\alpha,\beta) d\alpha d\beta = \Phi(m,n) \quad \text{Equation 9}$$

However, the integral equation above cannot be solved exactly because the low pass filtering of the projection pupil and the finite size of the illuminator prevents representation of the first eigenfunction with the Fourier transform of the pitch frequency, Φ. However, Φ can be approximated by Φ':

$$\Phi'(m,n) = \int\int J(\alpha,\beta) K$$
$$= \left(\alpha + \frac{\lambda m}{P_x NA}, \beta + \frac{\lambda n}{P_x NA}\right) F(\alpha,\beta) d\alpha d\beta \quad \text{Equation 10}$$

The illumination pupil, J, is then solved by calculating the Φ' that maximizes a merit function, such as disclosed in equation 11. The merit function compares Φ'(m,n) in Equation 10 to the Fourier Transform of the pitch frequency Φ(m,n), and the merit function attempts to minimize the difference between Φ(m,n) and Φ'(m,n). The optimal illumination J(α,β) is calculated such Φ'(m,n) approximates Φ(m,n) with the least error. For example, the least error can be quantified through absolute error, root mean squared error, or minimum error. The merit function in Equation 11 minimizes the absolute error between Φ(m,n) and Φ'(m,n). It should be noted that merit functions are well known in the art, and merit functions other than the one illustrated in equation 11 can be utilized in the present invention.

$$f = \int\int \phi'(x,y)\phi(x,y)dxdy \quad \text{Equation 11}$$

$$\phi'(x,y) = FT^{-1}\{\Phi'(m,n)\} \quad \text{Equation 12}$$

Equation 12 is the inverse Fourier transform of the first eigenfunction in Equation 10. Therefore, ϕ'(x,y) is the first eigenfunction in the spatial domain. This optimization equation is essentially the convolution of the first eigenfunction, ϕ', with the pitch frequency, ϕ.

After the integral equation of the TCC is solved, the next step in this process, step 20, is to define the optimal illumination for the full-chip layer. Examples of the optimal illumination will be described by referring to Examples 1 to 5.

The process described in this embodiment can also be extended to separate a design into multiple exposures. After the pitch frequency is calculated, the illumination is optimized. Using the first eigenfunction, $\phi_1'(x,y)$, with the optimized illumination, pitch frequencies that fall into a negative region of the first eigenfunction are separated into another contact layer to be imaged with a second exposure. For this second contact layer, the illumination is then optimized.

Again, using the first eigenfunction for this second illumination, $\phi_2'(x,y)$, pitch frequencies that fall into a negative region are separated into another contact layer. This separation technique is done multiple times to create multiple masks for multiple exposures. It is important to note that the multiple exposures are created by separating the design through illumination optimization.

EXAMPLE 1

Flash Memory Pattern with 250 nm Pitch Design Rule

Figure 2A:
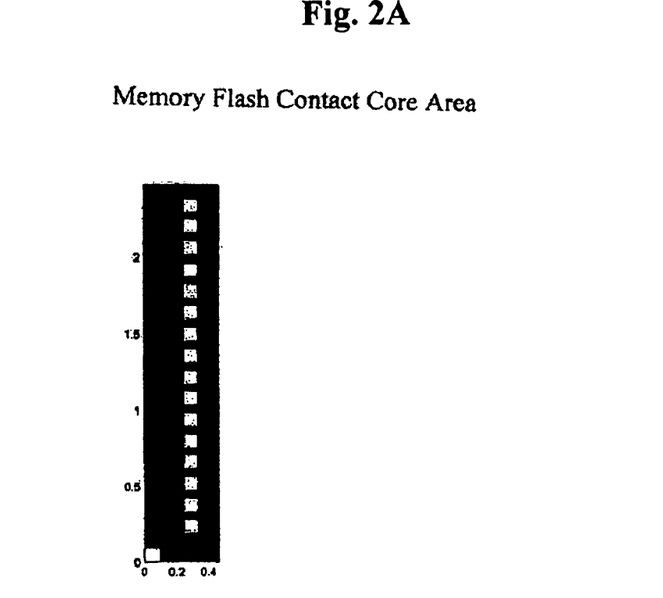
FIGS. 2A-2C illustrate an example of full chip source optimization for a flash memory pattern with 250 nm pitch design in accordance with an embodiment of the present invention.
Figure 2B:
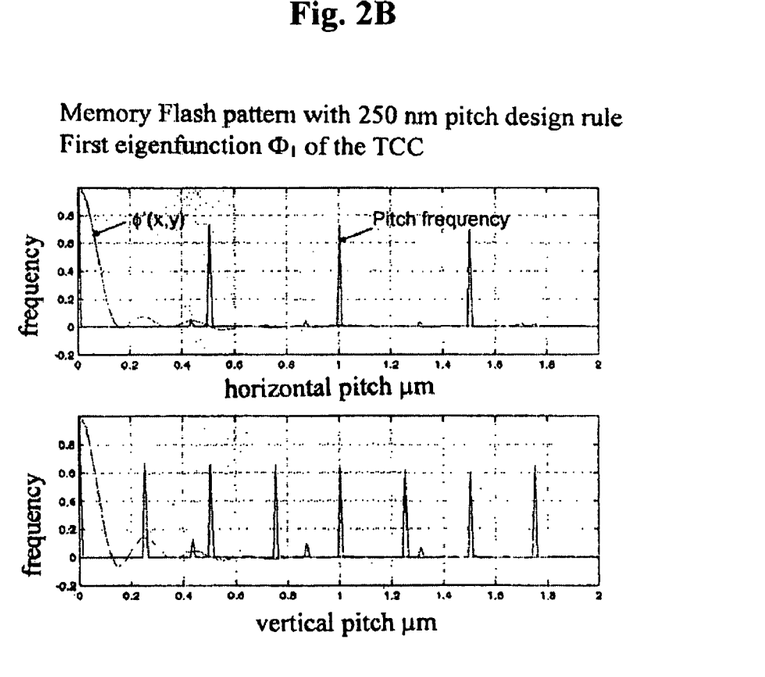
Figure 2C:
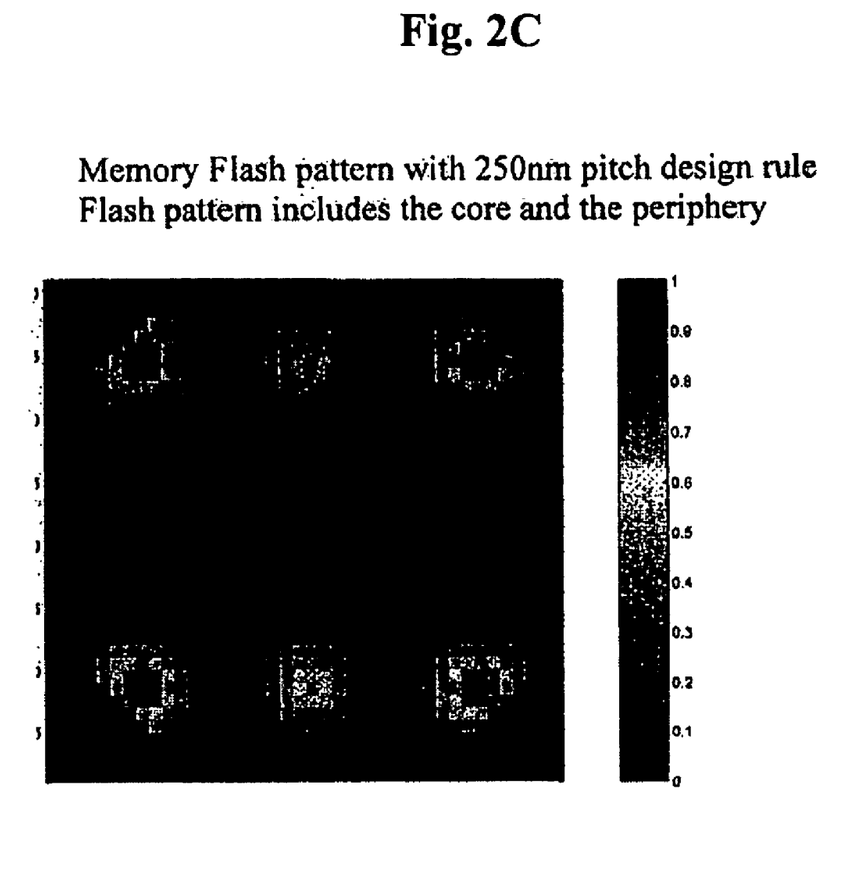

FIGS. 2A-2C illustrate an example of full chip source optimization for a flash memory pattern with 250 nm pitch design in accordance with an embodiment of the present invention. Using the illumination optimization process in this embodiment, the illumination can be optimized for a full chip flash memory. The full chip includes a flash cell and periphery portions. The flash cell has 16 holes that are dense in one direction with one isolated hole. This pattern represents the memory cell, and it is repeated millions of times in the design. This repeated flash cell is shown in FIG. 2A. The pitch between the dense contacts is 250 nm. In this flash memory example, the source is optimized for a KrF scanner with NA=0.8 which corresponds to a k1 half-pitch of 0.4.

In FIG. 2B, the pitch frequency histogram function, $\phi(x,y)$, of the flash memory example is plotted along the vertical and horizontal axes. From FIG. 2B, it is clear along the vertical axis that there is a pitch with a harmonic of 250 nm which results from the flash cell. Along the horizontal axis, the 500 nm pitch is common which is also the flash cell pitch along the horizontal axis.

Using the full-chip source optimization technique described in this embodiment, the source, $J(\alpha,\beta)$, was optimized for the pitch frequency in FIG. 2B. The optimal source is a six pole illuminator as illustrated in FIG. 2C. The quadrupole source is in the optimal location to maximize the contrast for a pitch of 250 nm. The optimal source also has a dipole along the y-axis which helps to improve the contrast of the 250 nm pitch along the vertical axis. This six pole source is a compromise for optimizing the contrast along the y-axis with the dipole part of the optimal source, while optimizing the contrast of pitches in the periphery portion with the quadrupole part of the optimal source.

The first eigenfunction, $\phi'(x,y)$, from the optimized source in FIG. 2C is also plotted in FIG. 2B. The first eigenfunction has its first side lobe along the vertical pitch at 250 nm. The second sidelobe of the first eigenfunction is capable of collecting the second harmonic of the 250 nm pitch while also improving the contrast of the periphery portion.

EXAMPLE 2

Flash Memory Pattern with 200 nm Pitch Design Rule

Figure 3A:
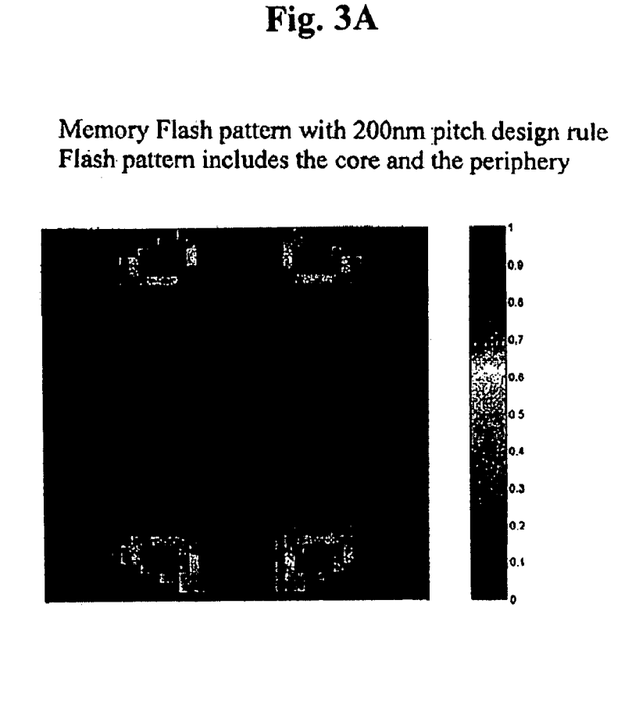
FIGS. 3A and 3B illustrate an example of full chip source optimization for a flash memory pattern with 200 nm pitch design in accordance with an embodiment of the present invention.
Figure 3B:
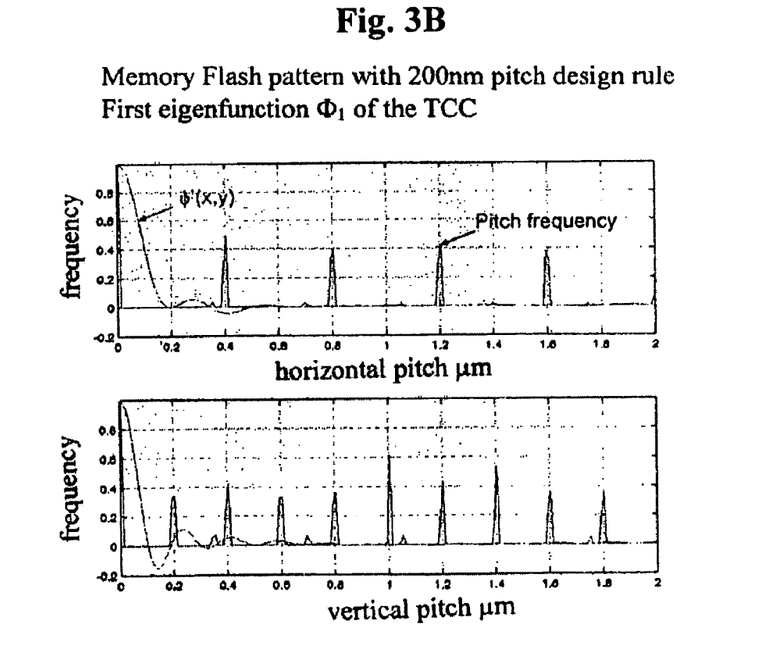

FIGS. 3A and 3B illustrate an example of full chip source optimization for a flash memory pattern with 200 nm pitch design in accordance with an embodiment of the present invention. FIG. 3A illustrates optimized illumination for a flash memory core and periphery portion (see, FIG. 2A showing the core). The pitch frequency of the core and periphery portion is shown in FIG. 3B.

EXAMPLE 3

Contact Array Pitch of 250 nm

Figure 4A:
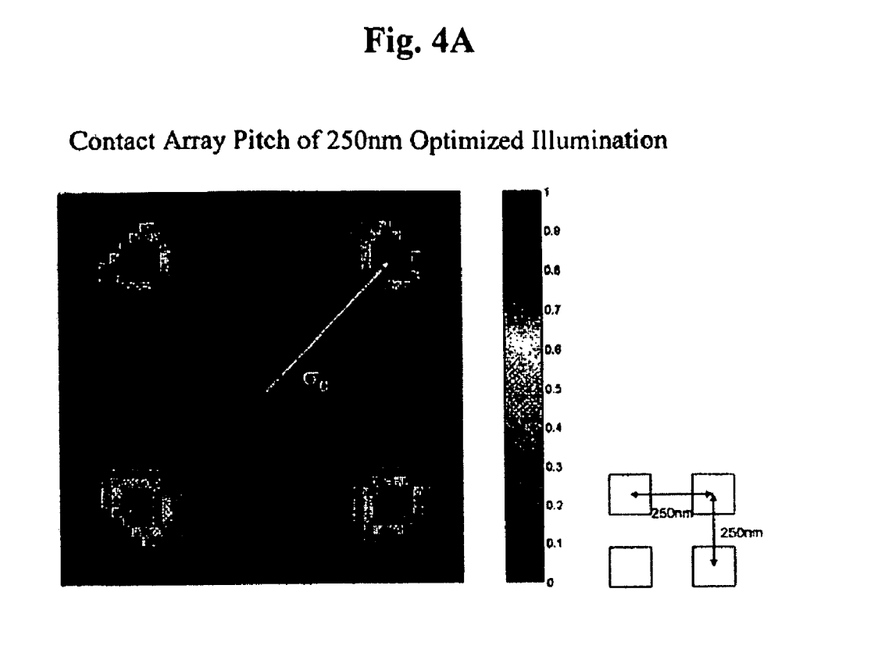
FIGS. 4A and 4B illustrate an example of full chip source optimization for a contact array having a pitch of 250 nm in accordance with an embodiment of the present invention.
Figure 4B:
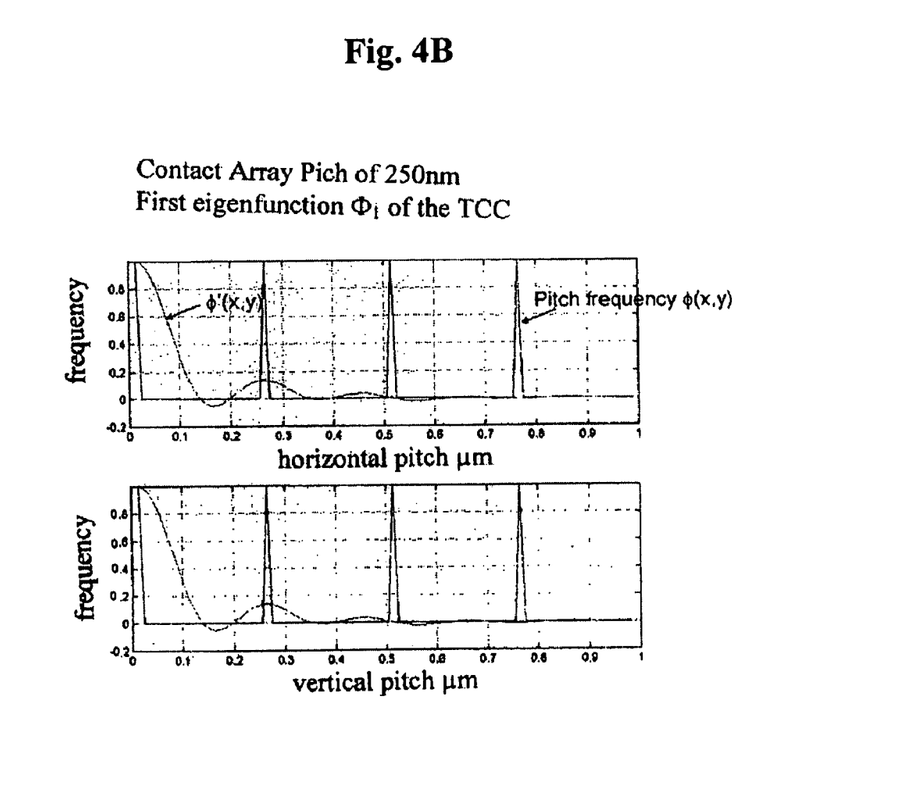

FIGS. 4A and 4B illustrate an example of full chip source optimization for a contact array having a pitch of 250 nm in accordance with an embodiment of the present invention. FIG. 4A illustrates optimized illumination for a contact array pitch of 250 nm. The pitch frequency is shown in FIG. 4B. Optimal $\sigma_c$ of the contact hole pattern is given by equation 13.

$$\sigma_c = \frac{\lambda}{\sqrt{2}\,NAP} \qquad \text{Equation 13}$$

$\sigma_c$ with the optimization process agrees with the calculated value. Equation 13 is well known among persons skilled in microscopy and lithography technologies. Equation 13 is obtained by choosing an illumination such that the zero and first diffraction order overlap perfectly in the spatial frequency domain.

EXAMPLE 4

Contact Array Pitch of 200 mm

Figure 5A:
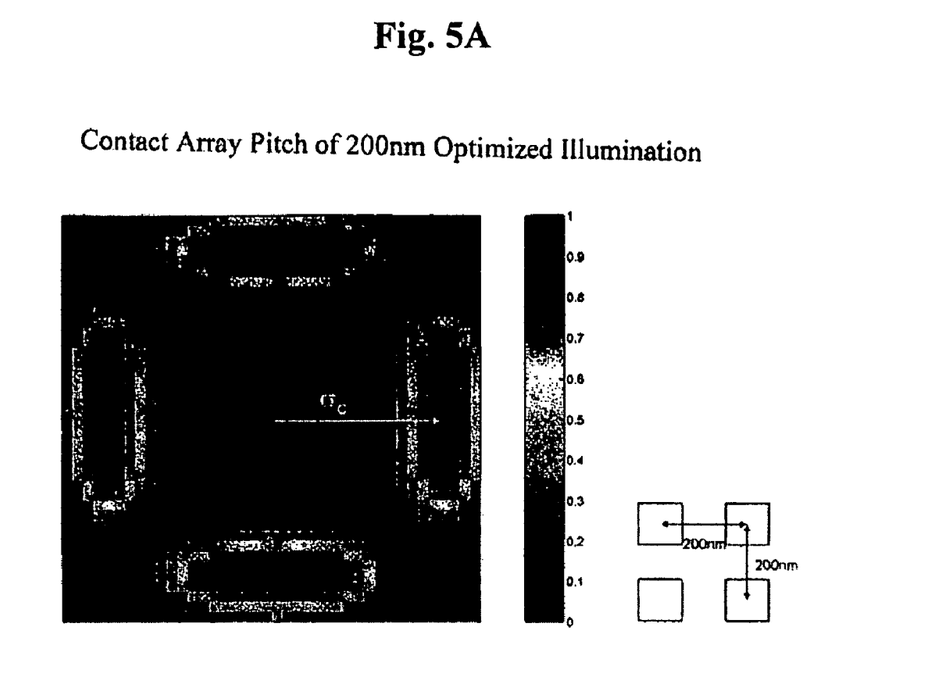
FIGS. 5A and 5B illustrate an example of full chip source optimization for a contact array having a pitch of 200 nm in accordance with an embodiment of the present invention.
Figure 5B:
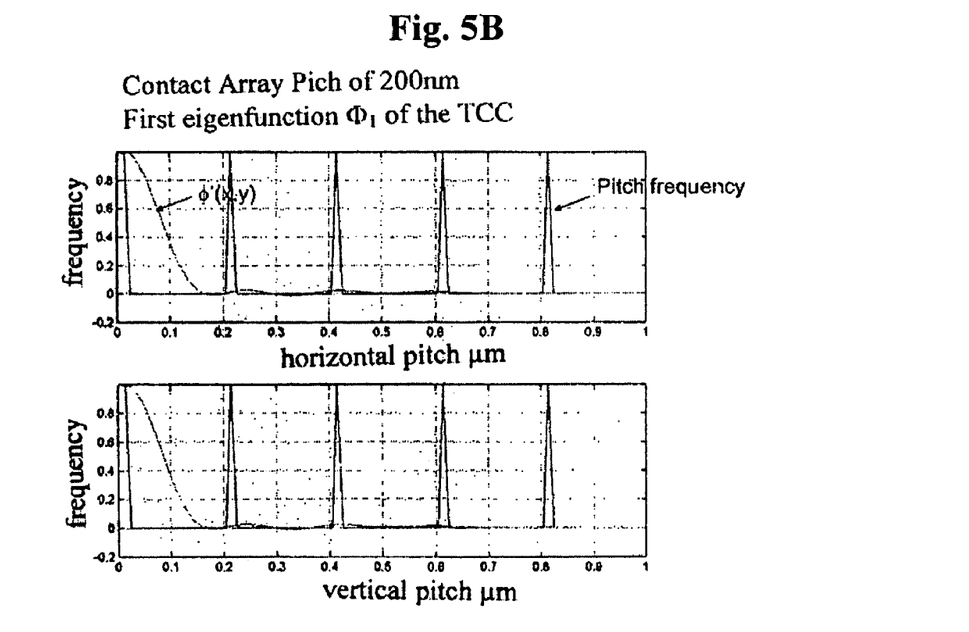

FIGS. 5A and 5B illustrate an example of full chip source optimization for a contact array having a pitch of 200 nm in accordance with an embodiment of the present invention. FIG. 5A illustrates optimized illumination for a contact array pitch of 200 nm. The pitch frequency is shown in FIG. 5B. Optimal $\sigma_c$ of the contact hole pattern is given by equation 14.

$$\sigma_c = \frac{\lambda}{2NAP} \qquad \text{Equation 14}$$

$\sigma_c$ with the optimization process agrees with the calculated value. Equation 14 is well known among persons skilled in microscopy and lithography technologies. Equation 14 is obtained by choosing an illumination such that the zero and first diffraction order overlap perfectly in the spatial frequency domain.

EXAMPLE 5

Periodic DRAM Pattern

Figure 6A:
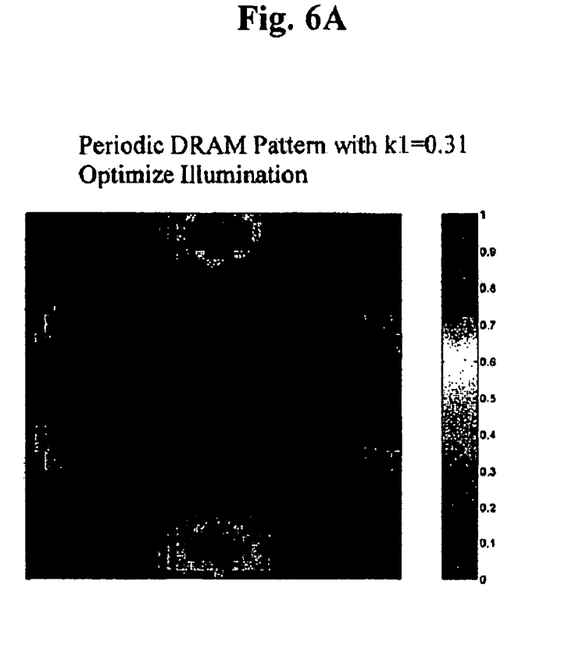
FIGS. 6A and 6B illustrate an example of full chip source optimization for a periodic DRAM pattern with k1=0.31 in accordance with an embodiment of the present invention.
Figure 6B:
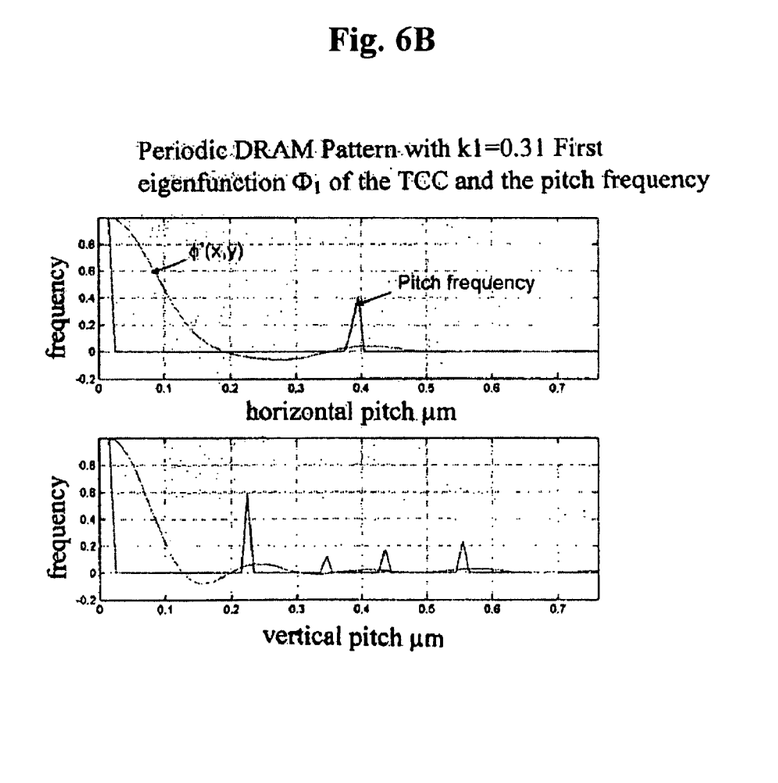

FIGS. 6A and 6B illustrate an example of full chip source optimization for a periodic DRAM pattern with k1=0.31 in accordance with an embodiment of the present invention. FIG. 6A illustrates optimized illumination for a DRAM core. The pitch frequency of the DRAM core is shown in FIG. 6B.

According to the embodiment described above, it is possible to optimize the illumination for a full-chip layer. The technique described above improves the speed of computation and is easy to implement. In current illumination optimization techniques, the illuminator is optimized for a small piece of periodic geometry. These techniques work well, for example, for DRAM devices. However, in logic and flash memory for example, the illuminator must be optimized for a large area. The illuminator for a large area can be optimized with techniques used for optimizing DRAM devices. However, illumination optimization techniques for DRAM devices are computationally expensive. The embodiment described above is suitable for optimizing the illuminator for large area in a computationally inexpensive way. Current commercial EDA software can quickly calculate pitch histograms. These pitch histograms can be input into the technique in this embodiment. Consequently, little or no modification needs to be made to commercial DRC software. Because this technique is capable of optimizing the illumination for a large area or for a full chip, this technique improves the speed of computation over currently available illumination optimization techniques. Because this technique is capable of using current EDA software, this technique is easy to implement.

Figure 7:
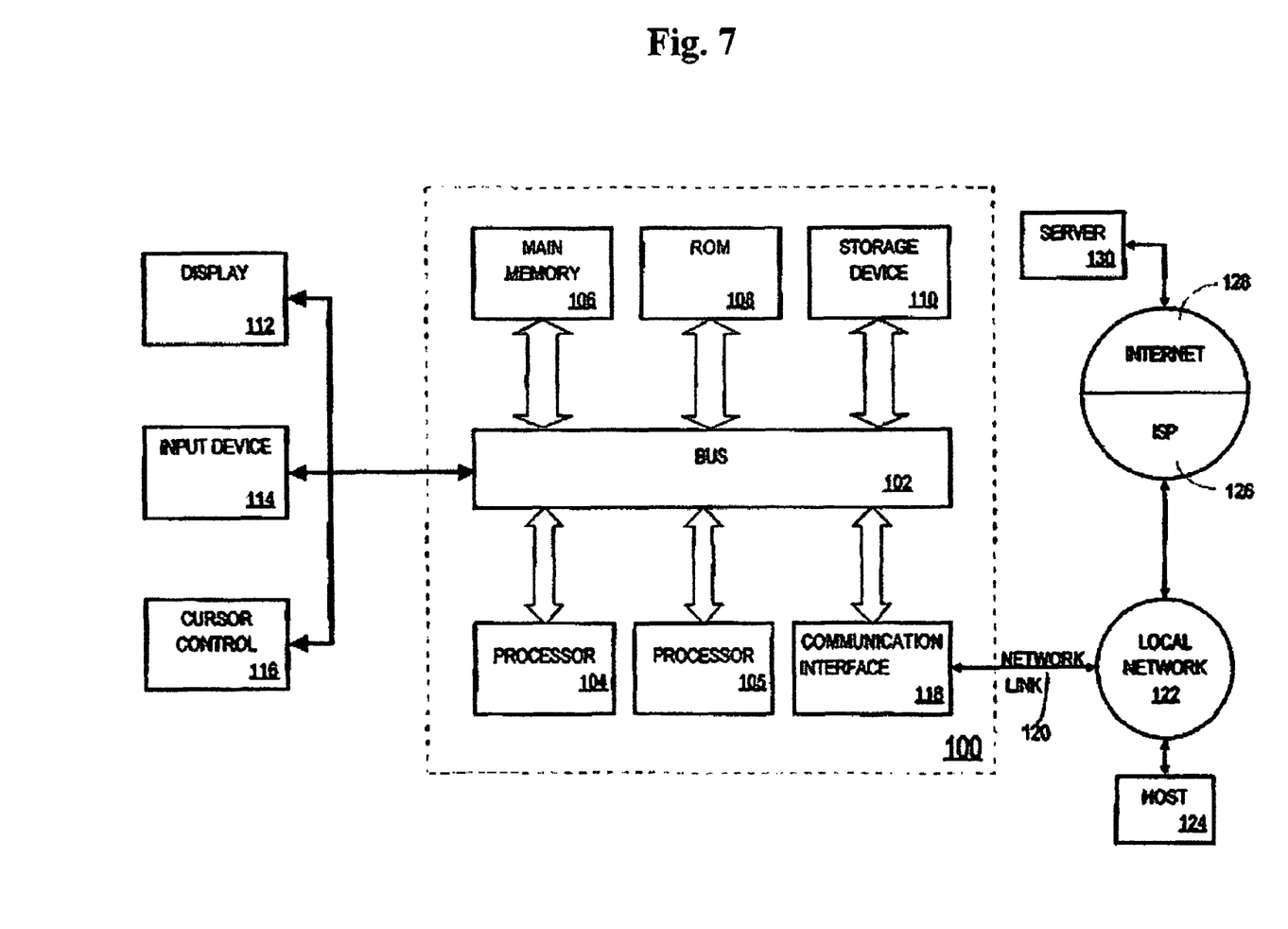
FIG. 7 is a block diagram that illustrates a computer system which can implement illumination optimization according to an embodiment of the present invention.

FIG. 7 is a block diagram that illustrates a computer system 100 which can implement the illumination optimization explained above. Computer system 100 includes a bus 102 or other communication mechanism for communicating information, and a processor 104 coupled with bus 102 for processing information. Computer system 100 also includes a main memory 106, such as a random access memory (RAM) or other dynamic storage device, coupled to bus 102 for storing information and instructions to be executed by processor 104. Main memory 106 also may be used for storing temporary variables or other intermediate information during execution of instructions to be executed by processor 104. Computer system 100 further includes a read only memory (ROM) 108 or other static storage device coupled to bus 102 for storing static information and instructions for processor 104. A storage device 110, such as a magnetic disk or optical disk, is provided and coupled to bus 102 for storing information and instructions.

Computer system 100 may be coupled via bus 102 to a display 112, such as a cathode ray tube (CRT) or flat panel or touch panel display for displaying information to a computer user. An input device 114, including alphanumeric and other keys, is coupled to bus 102 for communicating information and command selections to processor 104. Another type of user input device is cursor control 116, such as a mouse, a trackball, or cursor direction keys for communicating direction information and command selections to processor 104 and for controlling cursor movement on display 112. This input device typically has two degrees of freedom in two axes, a first axis (e.g., x) and a second axis (e.g., y), that allows the device to specify positions in a plane. A touch panel (screen) display may also be used as an input device.

According to one embodiment of the invention, the illumination optimization may be performed by computer system 100 in response to processor 104 executing one or more sequences of one or more instructions contained in main memory 106. Such instructions may be read into main memory 106 from another computer-readable medium, such as storage device 110. Execution of the sequences of instructions contained in main memory 106 causes processor 104 to perform the process steps described herein. One or more processors in a multi-processing arrangement may also be employed to execute the sequences of instructions contained in main memory 106. In alternative embodiments, hard-wired circuitry may be used in place of or in combination with software instructions to implement the invention. Thus, embodiments of the invention are not limited to any specific combination of hardware circuitry and software.

The term "computer-readable medium" as used herein refers to any medium that participates in providing instructions to processor 104 for execution. Such a medium may take many forms, including but not limited to, non-volatile media, volatile media, and transmission media. Non-volatile media include, for example, optical or magnetic disks, such as storage device 110. Volatile media include dynamic memory, such as main memory 106. Transmission media include coaxial cables, copper wire and fiber optics, including the wires that comprise bus 102. Transmission media can also take the form of acoustic or light waves, such as those generated during radio frequency (RF) and infrared (IR) data communications. Common forms of computer-readable media include, for example, a floppy disk, a flexible disk, hard disk, magnetic tape, any other magnetic medium, a CD-ROM, DVD, any other optical medium, punch cards, paper tape, any other physical medium with patterns of holes, a RAM, a PROM, and EPROM, a FLASH-EPROM, any other memory chip or cartridge, a carrier wave as described hereinafter, or any other medium from which a computer can read.

Various forms of computer readable media may be involved in carrying one or more sequences of one or more instructions to processor 104 for execution. For example, the instructions may initially be borne on a magnetic disk of a remote computer. The remote computer can load the instructions into its dynamic memory and send the instructions over a telephone line using a modem. A modem local to computer system 100 can receive the data on the telephone line and use an infrared transmitter to convert the data to an infrared signal. An infrared detector coupled to bus 102 can receive the data carried in the infrared signal and place the data on bus 102. Bus 102 carries the data to main memory 106, from which processor 104 retrieves and executes the instructions. The instructions received by main memory 106 may optionally be stored on storage device 110 either before or after execution by processor 104.

Computer system 100 also preferably includes a communication interface 118 coupled to bus 102. Communication interface 118 provides a two-way data communication coupling to a network link 120 that is connected to a local network 122. For example, communication interface 118 may be an integrated services digital network (ISDN) card or a modem to provide a data communication connection to a corresponding type of telephone line. As another example, communication interface 118 may be a local area network (LAN) card to provide a data communication connection to a compatible LAN. Wireless links may also be implemented. In any such implementation, communication interface 118 sends and receives electrical, electromagnetic or optical signals that carry digital data streams representing various types of information.

Network link 120 typically provides data communication through one or more networks to other data devices. For example, network link 120 may provide a connection through local network 122 to a host computer 124 or to data equipment operated by an Internet Service Provider (ISP) 126. ISP 126 in turn provides data communication services through the worldwide packet data communication network, now commonly referred to as the "Internet" 128. Local network 122 and Internet 128 both use electrical, electromagnetic or optical signals that carry digital data streams. The signals through the various networks and the signals on network link 120 and through communication interface 118, which carry the digital data to and from computer system 100, are exemplary forms of carrier waves transporting the information.

Computer system 100 can send messages and receive data, including program code, through the network(s), network link 120, and communication interface 118. In the Internet example, a server 130 might transmit a requested code for an application program through Internet 128, ISP 126, local network 122 and communication interface 118. In accordance with the invention, one such downloaded application provides for the illumination optimization of the embodiment, for example. The received code may be executed by processor 104 as it is received, and/or stored in storage device 110, or other non-volatile storage for later execution. In this manner, computer system 100 may obtain application code in the form of a carrier wave.

Figure 8:
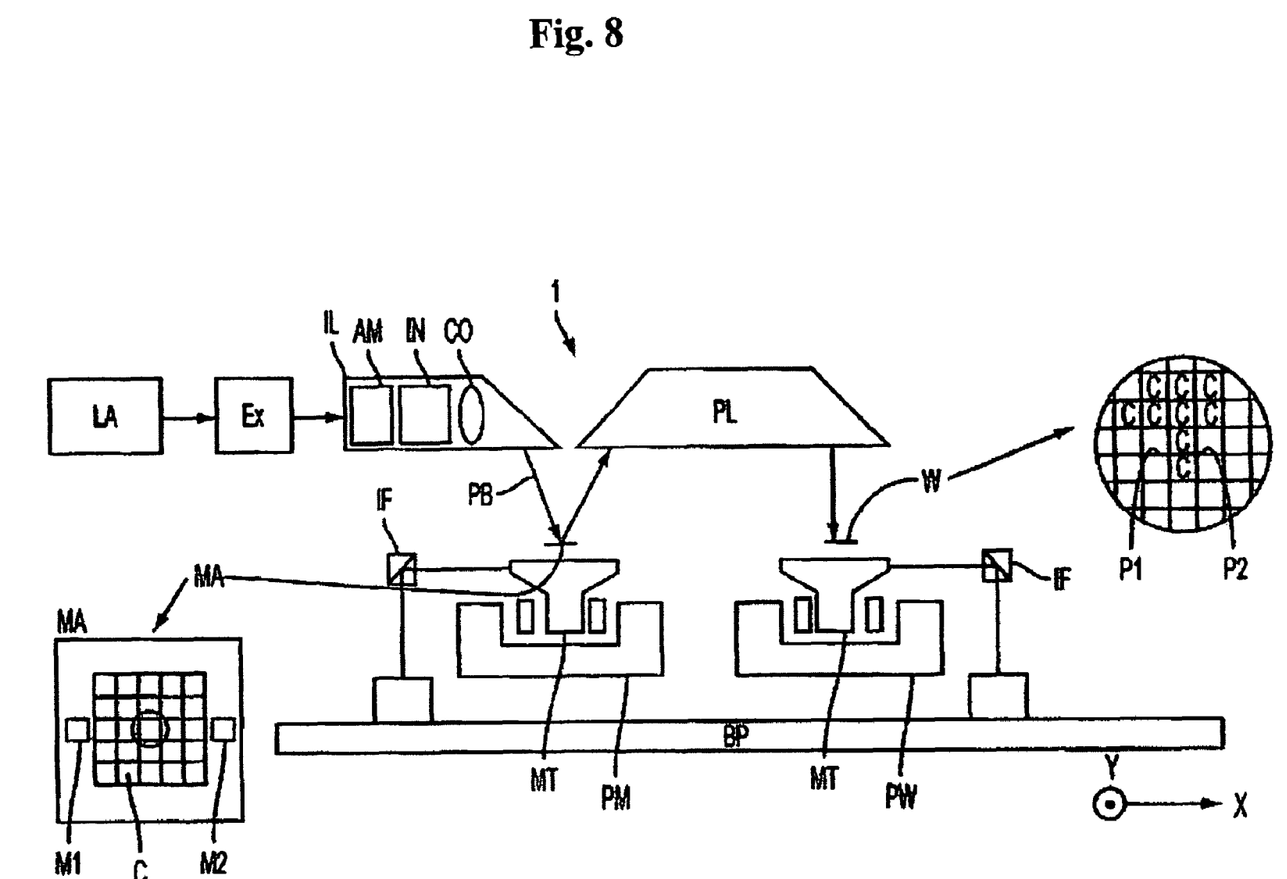
FIG. 8 schematically depicts a lithographic projection apparatus suitable for use with a mask designed with the aid of an embodiment of the present invention.

FIG. 8 schematically depicts a lithographic projection apparatus suitable for use with a mask designed with the aid of the current invention. The apparatus comprises:

- a radiation system Ex, IL, for supplying a projection beam PB of radiation. In this particular case, the radiation system also comprises a radiation source LA;
- a first object table (mask table) MT provided with a mask holder for holding a mask MA (e.g., a reticle), and connected to first positioning means for accurately positioning the mask with respect to item PL;
- a second object table (substrate table) WT provided with a substrate holder for holding a substrate W (e.g., a resist-coated silicon wafer), and connected to second positioning means for accurately positioning the substrate with respect to item PL;
- a projection system ("lens") PL (e.g., a refractive, catoptric or catadioptric optical system) for imaging an irradiated portion of the mask MA onto a target portion C (e.g., comprising one or more dies) of the substrate W.

As depicted herein, the apparatus is of a transmissive type (i.e., has a transmissive mask). However, in general, it may also be of a reflective type, for example (with a reflective mask). Alternatively, the apparatus may employ another kind of patterning means as an alternative to the use of a mask; examples include a programmable mirror array or LCD matrix.

The source LA (e.g., a mercury lamp or excimer laser) produces a beam of radiation. This beam is fed into an illumination system (illuminator) IL, either directly or after having traversed conditioning means, such as a beam expander Ex, for example. The illuminator IL may comprise adjusting means AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 8 that the source LA may be within the housing of the lithographic projection apparatus (as is often the case when the source LA is a mercury lamp, for example), but that it may also be remote from the lithographic projection apparatus, the radiation beam that it produces being led into the apparatus (e.g., with the aid of suitable directing mirrors); this latter scenario is often the case when the source LA is an excimer laser (e.g., based on KrF, ArF or $F_2$ lasing). The current invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning means (and interferometric measuring means IF), the substrate table WT can be moved accurately, e.g., so as to position different target portions C in the path of the beam PB. Similarly, the first positioning means can be used to accurately position the mask MA with respect to the path of the beam PB, e.g., after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 8. However, in the case of a wafer stepper (as opposed to a step-and-scan tool) the mask table MT may just be connected to a short-stroke actuator, or may be fixed.

The depicted tool can be used in two different modes:

- In step mode, the mask table MT is kept essentially stationary, and an entire mask image is projected in one go (i.e., a single "flash") onto a target portion C. The substrate table WT is then shifted in the x and/or y directions so that a different target portion C can be irradiated by the beam PB;
- In scan mode, essentially the same scenario applies, except that a given target portion C is not exposed in a single "flash". Instead, the mask table MT is movable in a given direction (the so-called "scan direction", e.g., the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Although the present invention has been described and illustrated in detail, it is to be clearly understood that the same is by way of illustration and example only and is not to be taken by way of limitation, the scope of the present invention being limited only by the terms of the appended claims.

What is claimed is:

1. A method of optimizing illumination for a full-chip layer, comprising the steps of:
   - determining a pitch frequency of the full-chip layer, the pitch frequency indicating how often a pitch occurs in the full-chip layer so as to generate a pitch frequency histogram of the full-chip layer;
   - equating the pitch frequency histogram to be a first eigenfunction of the sum of coherent systems representation of a transformation cross coefficient; and
   - solving an integral equation for the first eigenfunction of the transformation cross coefficient so as to define the optimal illumination for the full-chip layer.

2. The method according to claim 1, wherein all pitches are equally weighted in the pitch frequency histogram.

3. The method according to claim 1, wherein the integral equation for the first eigenfunction of the transformation cross coefficient is solved such that the first eigenfunction becomes substantially identical to the pitch frequency.

4. The method according to claim 3, wherein a difference between the pitch frequency and the first eigenfunction is minimized by using a merit function to solve the integral equation for the first eigenfunction of the transformation cross coefficient.

5. The method according to claim 1, wherein the merit function is essentially the convolution of the first eigenfunction with the pitch frequency.

6. The method according to claim 1, wherein the integral equation for the first eigenfunction of the transformation cross coefficient is solved such that the first eigenfunction has a value of one for every non-zero value in the pitch frequency.

7. The method according to claim 1, wherein the pitch frequency is obtained by determining the separation between adjacent features on the full-chip layer that are within a coherence radius.

8. The method according to claim 1, wherein the pitch frequency is obtained by representing adjacent features on the full-chip layer with Dirac delta functions and measuring separation between the Dirac delta functions.

9. The method according to claim 1, wherein the pitch frequency for a random hole pattern or for a periodic hole pattern is obtained as a function of hole separation and as a function of angular separation.

10. The method according to claim 1, further comprising:
determining whether pitch frequencies fall into a negative region of the first eigenfunction by using the optimized illumination;
separating the pitch frequencies which fall into the negative region into another layer to be imaged with a second exposure; and
optimizing illumination for said another layer.

11. A computer program product having a computer readable storage medium bearing a computer program for optimizing illumination for a full-chip layer, the computer program, which executed, causing a computer to perform the steps of:
determining a pitch frequency of the full-chip layer, the pitch frequency indicating how often a pitch occurs in the full-chip layer so as to generate a pitch frequency histogram of the full-chip layer;
equating the pitch frequency histogram to be a first eigenfunction of the sum of coherent systems representation of a transformation cross coefficient; and
solving an integral equation for the first eigenfunction of the transformation cross coefficient so as to define the optimal illumination for the full-chip layer.

12. The computer program product according to claim 11, wherein all pitches are equally weighted in the pitch frequency histogram.

13. The computer program product according to claim 11, wherein the integral equation for the first eigenfunction of the transformation cross coefficient is solved such that the first eigenfunction becomes substantially identical to the pitch frequency.

14. The computer program product according to claim 13, wherein a difference between the pitch frequency and the first eigenfunction is minimized by using a merit function to solve the integral equation for the first eigenfunction of the transformation cross coefficient.

15. The computer program product according to claim 11, wherein the merit function is essentially the convolution of the first eigenfunction with the pitch frequency.

16. The computer program product according to claim 11, wherein the integral equation for the first eigenfunction of the transformation cross coefficient is solved such that the first eigenfunction has a value of one for every non-zero value in the pitch frequency.

17. The computer program product according to claim 11, wherein the pitch frequency is obtained by determining the separation between adjacent features on the full-chip layer that are within a coherence radius.

18. The computer program product according to claim 11, wherein the pitch frequency is obtained by representing adjacent features on the full-chip layer with Dirac delta functions and measuring separation between the Dirac delta functions.

19. The computer program product according to claim 11, wherein the pitch frequency for a random hole pattern or for a periodic hole pattern is obtained as a function of hole separation and as a function of angular separation.

20. The computer program product according to claim 11, further comprising:
determining whether pitch frequencies fall into a negative region of the first eigenfunction by using the optimized illumination;
separating the pitch frequencies which fall into the negative region into another layer to be imaged with a second exposure; and
optimizing illumination for said another layer.

21. An apparatus for optimizing illumination for a full-chip layer, comprising:
a first unit configured for determining a pitch frequency of the full-chip layer, the pitch frequency indicating how often a pitch occurs in the full-chip layer so as to generate a pitch frequency histogram of the full-chip layer;
a second unit configured for equating the pitch frequency histogram to be a first eigenfunction of the sum of coherent systems representation of a transformation cross coefficient; and
a third unit configured for solving an integral equation for the first eigenfunction of the transformation cross coefficient so as to define the optimal illumination for the full-chip layer.

22. The apparatus according to claim 21, wherein the first unit weights all pitches equally in the pitch frequency histogram.

23. The apparatus according to claim 21, wherein the third unit solves the integral equation for the first eigenfunction of the transformation cross coefficient such that the first eigenfunction becomes substantially identical to the pitch frequency.

24. The apparatus according to claim 23, wherein the third unit minimizes a difference between the pitch frequency and the first eigenfunction by using a merit function to solve the integral equation for the first eigenfunction of the transformation cross coefficient.

25. The apparatus according to claim 21, wherein the merit function is essentially the convolution of the first eigenfunction with the pitch frequency.

26. The apparatus according to claim 21, wherein the third unit solves the integral equation for the first eigenfunction of the transformation cross coefficient such that the first eigenfunction has a value of one for every non-zero value in the pitch frequency.

27. The apparatus according to claim 21, wherein the first unit obtains the pitch frequency by determining the separation between adjacent features on the full-chip layer that are within a coherence radius.

28. The apparatus according to claim 21, wherein the first unit obtains the pitch frequency by representing adjacent features on the full-chip layer with Dirac delta functions and measuring separation between the Dirac delta functions.

29. The apparatus according to claim 21, wherein the first unit obtains the pitch frequency for a random hole pattern or for a periodic hole pattern as a function of hole separation and as a function of angular separation.

30. The apparatus according to claim 21, further comprising:
a fourth unit configured for determining whether pitch frequencies fall into a negative region of the first eigenfunction by using the optimized illumination; and
a fifth unit for separating the pitch frequencies which fall into the negative region into another layer to be imaged with a second exposure, wherein
optimizing illumination for said another layer is performed by the first to third unit.

31. A device manufacturing method comprising the steps of:
(a) providing a substrate that is at least partially covered by a layer of radiation-sensitive material;
(b) providing a projection beam of radiation using an imaging system;

(c) using a pattern on a mask to endow the projection beam with a pattern in its cross-section;
(d) projecting the patterned beam of radiation onto a target portion of the layer of radiation-sensitive material,
wherein in step (b) providing said projection beam includes the steps of:
determining a pitch frequency of a full-chip layer, the pitch frequency indicating how often a pitch occurs in the full-chip layer so as to generate a pitch frequency histogram of the full-chip layer;

equating the pitch frequency histogram to be a first eigenfunction of the sum of coherent systems representation of a transformation cross coefficient; and
solving an integral equation for the first eigenfunction of the transformation cross coefficient so as to define the optimal illumination for the full-chip layer.

\* \* \* \* \*